(12) United States Patent
Choi et al.

(10) Patent No.: US 11,682,680 B2
(45) Date of Patent: Jun. 20, 2023

(54) CRYSTALLINE OXIDE SEMICONDUCTOR THIN FILM, AND METHOD OF FORMING THE SAME AND THIN FILM TRANSISTOR AND METHOD OF MANUFACTURING THE SAME AND DISPLAY PANEL AND ELECTRONIC DEVICE

(71) Applicant: ADRC. CO. KR, Seoul (KR)

(72) Inventors: Soon Ho Choi, Yongin-si (KR); Chae Yeon Hwang, Seoul (KR); Suhui Lee, Seoul (KR)

(73) Assignee: ADRC. CO. KR, Seoul (KR)

( * ) Notice: Subject to any disclaimer, the term of this patent is extended or adjusted under 35 U.S.C. 154(b) by 92 days.

(21) Appl. No.: 17/201,212

(22) Filed: Mar. 15, 2021

(65) Prior Publication Data

US 2022/0208807 A1 Jun. 30, 2022

(30) Foreign Application Priority Data

Dec. 29, 2020 (KR) .................. 10-2020-0186260

(51) Int. Cl.
H01L 27/12 (2006.01)
(52) U.S. Cl.
CPC ...... H01L 27/1285 (2013.01); H01L 27/1225 (2013.01)
(58) Field of Classification Search
CPC ............ H01L 27/1285; H01L 27/1225; H01L 27/3262; H01L 29/7869; H01L 29/66969; H01L 29/04; H01L 29/103
See application file for complete search history.

(56) References Cited

U.S. PATENT DOCUMENTS

| 8,642,402 | B2 * | 2/2014 | Yano | H01L 29/66969 257/51 |
| 9,224,820 | B2 * | 12/2015 | Ha | H01L 29/7869 |
| 9,941,415 | B2 * | 4/2018 | Nakayama | H01L 29/24 |
| 10,916,662 | B2 * | 2/2021 | Guan | H01L 27/1285 |
| 11,251,310 | B2 * | 2/2022 | Inoue | C04B 35/01 |
| 2011/0050733 | A1 * | 3/2011 | Yano | C23C 14/3414 438/166 |
| 2013/0320336 | A1 * | 12/2013 | Ha | H01L 29/7869 257/43 |
| 2017/0047206 | A1 * | 2/2017 | Nakayama | H01L 21/02422 |
| 2019/0378933 | A1 * | 12/2019 | Inoue | H01L 29/26 |

(Continued)

FOREIGN PATENT DOCUMENTS

CN 103050412 * 12/2012 ............. H01L 21/34

OTHER PUBLICATIONS

K. Nomura et al., "Thin-Film Transistor Fabricated in Single-Crystalline Transparent Oxide Semiconductor," 2003, Nature, vol. 300, No. 5623, pp. 1269-1272, May 23, 2003 (Year: 2006).*

(Continued)

Primary Examiner — Nikolay K Yushin
(74) Attorney, Agent, or Firm — Lex IP Meister, PLLC

(57) ABSTRACT

Disclosed are a crystalline oxide semiconductor thin film including a crystalline oxide semiconductor including indium, gallium, and tin, the crystalline oxide semiconductor exhibiting a (009) diffraction peak in an X-ray diffraction spectrum, and a method of forming the same, a thin film transistor and a method of manufacturing the same, a display panel, and an electronic device.

16 Claims, 12 Drawing Sheets

(56) References Cited

U.S. PATENT DOCUMENTS

2020/0140337 A1* 5/2020 Inoue .................. C04B 35/01
2020/0185535 A1* 6/2020 Guan ............... H01L 29/78693

OTHER PUBLICATIONS

Hur et al., "Stretchable Polymer Gate Dielectric by Ultraviolet-Assisted Hafnium Oxide Doping at Low Temperature for High-Performance Indium Gallium Tin Oxide Transistors", 2019, ACS Applied Materials & Interfaces, vol. 11 p. 21675-21685 (May 24, 2019) (Year: 2019).*
Yamazaki et al., "Properties of crystalline In—Ga—Zn-oxide semiconductor and its transistor characteristics", 2014, Japanese Journal of Applied Physics, vol. 53 04ED18 (Mar. 31, 2014). (Year: 2014).*
Jeong et al., effect of Annealing Atmosphere on Electrical Performance and Stability of High-Mobility Indium-Gallium-Tin Oxide Thin-Film Transistors, 2020, Electronics 2020, 1875, pp. 2-10 (Nov. 7, 2020); (Year: 2020).*
Kim et al., "Achieving High Mobility in IGTO Thin-Film Transistors ata Low Temperature via Film Densification", 2018, IEEE Transactions on Electron Devices, vol. 65, No. 11, pp. 4854-4860, Sep. 18, 2018 (Year: 2018).*

* cited by examiner

CRYSTALLINE OXIDE SEMICONDUCTOR THIN FILM, AND METHOD OF FORMING THE SAME AND THIN FILM TRANSISTOR AND METHOD OF MANUFACTURING THE SAME AND DISPLAY PANEL AND ELECTRONIC DEVICE

CROSS-REFERENCE TO RELATED APPLICATION

This application claims priority to and the benefit of Korean Patent Application No. 10-2020-0186260 filed in the Korean Intellectual Property Office on Dec. 29, 2020, the entire contents of which are incorporated herein by reference.

BACKGROUND

1. Field

A crystalline oxide semiconductor thin film and a method of forming the same, a thin film transistor and a method of manufacturing the same, and a display panel and an electronic device are disclosed.

2. Description of the Related Art

A display device such as a liquid crystal display (LCD) or an organic light emitting diode display (OLED display) includes a thin film transistor (TFT) that is a three-terminal device as a switching device and/or a driving device. Recently, as such a thin film transistor, a thin film transistor including an oxide semiconductor has been studied. However, oxide semiconductors are mostly included in an amorphous state, and in this case, there is a limit to improving electrical properties and stability thereof.

SUMMARY

An embodiment provides a crystalline oxide semiconductor thin film that is capable of having improved electrical properties and reliability.

Another embodiment provides a method of forming the crystalline oxide semiconductor thin film.

Another embodiment provides a thin film transistor including the crystalline oxide semiconductor thin film.

Another embodiment provides a method of manufacturing the thin film transistor.

Another embodiment provides a display panel including the thin film transistor.

Another embodiment provides an electronic device including the thin film transistor.

According to an embodiment, a crystalline oxide semiconductor thin film includes a crystalline oxide semiconductor including indium, gallium, and tin and exhibiting a (009) diffraction peak in an XRD spectrum.

The crystalline oxide semiconductor may have a c-axis oriented crystal plane.

The crystalline oxide semiconductor thin film may have a thickness of about 20 nm to about 200 nm.

According to another embodiment, a thin film transistor includes the crystalline oxide semiconductor thin film, a gate electrode that is at least partially overlapped with the crystalline oxide semiconductor thin film, and a source electrode and a drain electrode electrically connected to the crystalline oxide semiconductor thin film.

According to another embodiment, a method of forming a crystalline oxide semiconductor thin film includes forming an amorphous oxide thin film including indium, gallium, and tin on a substrate, and annealing the amorphous oxide thin film to form a crystalline oxide semiconductor thin film exhibiting a (009) diffraction peak in the XRD spectrum.

The forming of the amorphous oxide thin film may be performed by a vapor deposition process or a solution process.

The annealing of the amorphous oxide thin film may include heat-treatment at a temperature of about 500° C. to about 800° C. using a heating device.

The heating device may include a furnace or a hot plate.

The annealing of the amorphous oxide thin film may include rapid thermal annealing.

The rapid thermal annealing may be performed at a temperature of about 700° C. to about 950° C.

The rapid thermal annealing may include raising the temperature at a rate of about 350° C./min to about 600° C./min and cooling at a rate of about 350° C./min to about 600° C./min.

The annealing of the amorphous oxide thin film may include laser annealing.

The laser annealing may be blue diode laser annealing or excimer laser annealing.

According to another embodiment, a method of manufacturing a thin film transistor includes forming a crystalline oxide semiconductor thin film by the above method, forming a gate electrode that is at least partially overlapped with the crystalline oxide semiconductor thin film, and forming a source electrode and a drain electrode electrically connected to the crystalline oxide semiconductor thin film.

According to another embodiment, a display panel including the thin film transistor is provided.

According to another embodiment, an electronic device including the thin film transistor is provided.

A crystalline oxide semiconductor thin film and a thin film transistor having improved electrical properties and reliability may be implemented.

DETAILED DESCRIPTION

Figure 1:
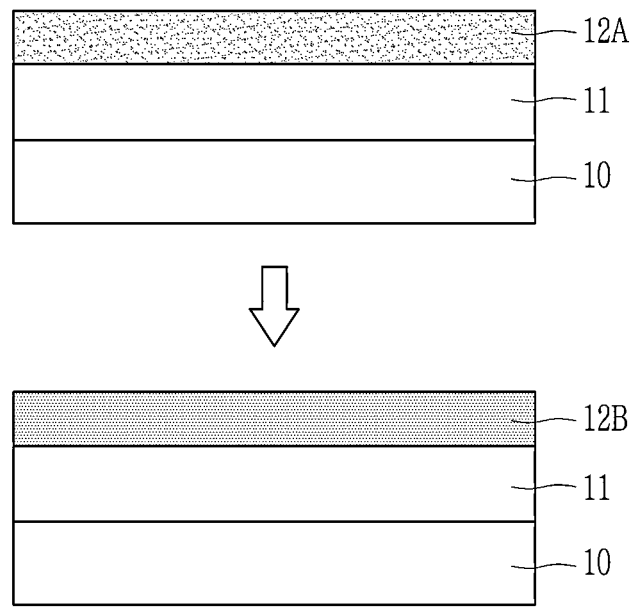
FIG. 1 is a schematic cross-sectional view showing a method of forming a crystalline oxide semiconductor thin film according to an embodiment.

Hereinafter, example embodiments of the present disclosure will be described in detail so that a person skilled in the art would understand the same. This disclosure may, however, be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, "combination" includes a mixture or a stacked structure of two or more.

Hereinafter, a crystalline oxide semiconductor thin film according to an embodiment is provided.

The crystalline oxide semiconductor thin film according to an embodiment may include a crystalline oxide semiconductor including one or more metals and/or semi-metals, and may be a crystalline indium-gallium-tin oxide semiconductor thin film including indium (In), gallium (Ga), and tin (Sn).

For example, the crystalline indium-gallium-tin oxide semiconductor thin film may be made of indium (In), gallium (Ga), and tin (Sn) as metal elements.

For example, the crystalline indium-gallium-tin oxide semiconductor thin film may include indium (In), gallium (Ga), and tin (Sn) as main components, and may further include one or more other elements (e.g., a metal or semi-metal) as a dopant, in addition to indium (In), gallium (Ga), and tin (Sn).

In the crystalline indium-gallium-tin oxide semiconductor thin film, more indium (In) may be included than gallium (Ga) and tin (Sn). For example, the number (or number of moles) of indium (In) may be included at about 1.5 times or more, about 2 times or more, or about 3 times or more, and within the above range, about 1.5 times to about 8 times, about 2 times to about 8 times, or about 3 to about 8 times with respect to the amount (or number of moles) of each of gallium (Ga) and tin (Sn).

For example, in the crystalline indium-gallium-tin oxide semiconductor thin film, the indium (In) may be included in an amount of greater than or equal to about 50 at %, and within the above range, greater than or equal to about 60 at %, or greater than or equal to about 70 at %, within the above range, about 50 at % to about 80 at %, about 60 at % to about 80 at %, or about 70 at % to about 80 at %, with respect to the sum of indium (In), gallium (Ga), and tin (Sn).

For example, in the crystalline indium-gallium-tin oxide semiconductor thin film, the gallium (Ga) may be included in an amount of greater than or equal to about 10 at %, and within the above range, greater than or equal to about 12 at %, or greater than or equal to about 15 at %, within the above range, greater than or equal to about 10 at % and less than about 50 at %, about 10 at % to about 40 at %, about 10 at % to about 30 at %, or about 10 at % to about 25 at %, with respect to the sum of indium (In), gallium (Ga), and tin (Sn).

For example, in the crystalline indium-gallium-tin oxide semiconductor thin film, the tin (Sn) may be included in an amount of greater than or equal to about 10 at %, and within the above range, greater than or equal to about 12 at %, or greater than or equal to about 15 at %, within the above range, greater than or equal to about 10 at % and less than about 50 at %, about 10 at % to about 40 at %, about 10 at % to about 30 at %, or about 10 at % to about 25 at %, with respect to the sum of indium (In), gallium (Ga), and tin (Sn).

The crystalline indium-gallium-tin oxide semiconductor thin film may exhibit a specific diffraction peak in the X-ray diffraction (XRD) spectrum, for example, a (009) diffraction peak (2θ) of about 31 degrees (a certain point between about 30 degrees and 33 degrees) may appear. The (009) diffraction peak indicates a c-axis oriented crystal plane, and at least a portion of the crystalline indium-gallium-tin oxide semiconductor thin film may have such a c-axis oriented crystal plane. Accordingly, the crystalline indium-gallium-tin oxide semiconductor thin film may exhibit high charge mobility and electrical reliability compared with an amorphous oxide thin film and/or another crystalline oxide semiconductor thin film having no c-axis oriented crystal plane.

The thickness of the crystalline oxide semiconductor thin film may be about 20 nm to about 200 nm, and within the above range, about 20 nm to about 180 nm, about 25 nm to about 150 nm, or about 25 nm to about 100 nm.

Such a crystalline indium-gallium-tin oxide semiconductor thin film may be formed by various annealings.

FIG. 1 is a schematic cross-sectional view showing a method of forming a crystalline oxide semiconductor thin film according to an embodiment.

A forming process of the crystalline oxide semiconductor thin film 12B according to an embodiment includes forming an amorphous oxide thin film 12A including indium (In), gallium (Ga), and tin (Sn) on a substrate 10, and annealing the amorphous oxide thin film 12A to form a crystalline oxide semiconductor thin film 12B exhibiting a (009) diffraction peak in the XRD spectrum.

The substrate 10 may be a support substrate, for example, a glass plate, a metal plate, a polymer substrate, or a silicon wafer. As an example, the substrate 10 may be a glass plate or a polymer substrate, and the polymer substrate may include, for example, polyethylene terephthalate, polyethylene naphthalate, polycarbonate, polyacrylate, polymethyl methacrylate, polyimide, polyamide, polyamideimide, a copolymer thereof, or a combination thereof, but the present disclosure is not limited thereto.

The process may further include a forming of a buffer layer 11 on the substrate 10. The buffer layer 11 may include, for example, an organic material, an inorganic material, and/or an organic-inorganic material, and may include, for example, an oxide, a nitride, or an oxynitride. The buffer layer 11 may include, for example, a silicon oxide, a silicon nitride, a silicon oxynitride, or a combination thereof, but is not limited thereto. The buffer layer 11 may be one layer or two or more layers, and may cover the whole surface of the substrate 10.

The forming of the buffer layer 11 may be performed by, for example, a vapor deposition process or a solution process of an organic material, an inorganic material, and/or an organic-inorganic material on the substrate 10. The vapor deposition process may include, for example, physical vapor deposition (PVD) such as sputtering, chemical vapor deposition (CVD), atomic layer deposition, or a combination thereof, and the solution processes may include, for example, spin coating, slit coating, ink jet processes, spraying, or a combination thereof.

The buffer layer 11 may have a thickness of, for example, about 30 nm to about 1 μm, and within the above range, about 50 nm to about 800 nm or about 100 nm to about 800 nm.

The amorphous oxide thin film 12A may be formed on the buffer layer 11. The amorphous oxide thin film 12A may include an oxide including at least one metal and/or semimetal, and may be an amorphous indium-gallium-tin oxide thin film including indium (In), gallium (Ga), and tin (Sn).

For example, the amorphous indium-gallium-tin oxide thin film may be made of indium (In), gallium (Ga), and tin (Sn) as metal elements.

For example, the amorphous indium-gallium-tin oxide thin film may include metal elements of indium (In), gallium (Ga), and tin (Sn) as main components, and may further include one or more other elements (e.g., a metal or semimetal) as a dopant, in addition to indium (In), gallium (Ga), and tin (Sn).

The contents of indium (In), gallium (Ga), and tin (Sn) in the amorphous indium-gallium-tin oxide thin film are the same as the aforementioned crystalline indium-gallium-tin oxide semiconductor thin film.

The forming of the amorphous oxide thin film 12A may be performed by, for example, a vapor deposition process or a solution process. The vapor deposition processes may include physical vapor deposition (PVD) such as sputtering, chemical vapor deposition, atomic layer deposition, or a combination thereof. The solution processes may include, for example, spin coating, slit coating, ink jet processes, spraying, or a combination thereof. For example, the forming of the amorphous oxide thin film 12A may be formed by RF sputtering. For example, the forming of the amorphous oxide thin film 12A may be performed by, for example, spraying a precursor solution for an amorphous oxide and heat-treating the resultant. The spraying may be performed once to 50 times, for example, and spray pyrolysis may be performed by heat-treating at a temperature of about 300° C. to about 500° C.

The amorphous oxide thin film 12A may have a thickness of, for example, about 20 nm to about 200 nm, and within the above range, about 20 nm to about 180 nm, about 25 nm to about 150 nm, or about 25 nm to about 100 nm.

The annealing of the amorphous oxide thin film 12A may be a thermal annealing method at a relatively low temperature, compared with the heat-treating temperature in the conventional crystallization method.

The thermal annealing method may be, for example, a method using a heating device. The method of using a heating device may be performed by placing the substrate 10 on which the buffer layer 11 and the amorphous oxide thin film 12A are formed in a heating device such as a furnace or a hot plate, and heat-treating the resultant at a temperature of about 500° C. to about 800° C., and within the above range, about 550° C. to about 750° C., about 600° C. to about 750° C., about 650° C. to about 750° C., or about 650° C. to about 700° C., for about 1 minute to about 150 minutes, about 1 minute to about 120 minutes, about 1 minute to about 90 minutes, about 1 minute to about 60 minutes, or about 1 minute to about 30 minutes. The heat-treating may be performed in a nitrogen atmosphere, an oxygen atmosphere, or air.

The thermal annealing method may be, for example, rapid thermal annealing (RTA). The rapid thermal annealing (RTA) may require a short annealing time without causing a problem for the substrate 10 by rapidly increasing the temperature and rapidly cooling. The heating rate and cooling rate of the rapid thermal annealing (RTA) may be very high, and may be, for example, about 350° C./min to about 600° C./min, and within the above range, about 400° C./min to about 550° C./min, about 420° C./min to about 500° C./min, or about 450° C./min. The annealing temperature of the rapid thermal annealing may be, for example, less than about 1000° C., less than or equal to about 950° C., or less than or equal to about 900° C., and within the range, from about 700° C. to less than about 1000° C., about 700° C. to about 950° C., greater than or equal to about 750° C. and less than about 1000° C., about 750° C. to about 950° C., greater than or equal to about 800° C. and less than about 1000° C., or about 800° C. to about 950° C., and it may be performed for about 1 minute to about 60 minutes, about 1 minute to about 45 minutes, or about 1 minute to about 30 minutes. If the annealing temperature is increased, the annealing time may be shortened, while if the annealing temperature is decreased, the annealing time may be increased. The rapid thermal annealing may be, for example, performed in a nitrogen atmosphere.

In this way, the amorphous indium-gallium-tin oxide thin film may be crystallized by thermal annealing at a relatively low temperature compared with a conventional heat treatment for crystallization to form the crystalline indium-gallium-tin oxide thin film having a c-axis oriented crystal plane (XRD (009) diffraction peak). The c-axis oriented crystal plane (XRD (009) diffraction peak) by thermal annealing at a relatively low temperature is a crystallinity inherently observed in a crystalline indium-gallium-tin oxide semiconductor thin film. It is difficult to observe such crystallinity by thermal annealing other crystalline oxides such as, for example, indium-gallium-zinc oxide (IGZO) at relatively low temperatures described above.

Figure 2:
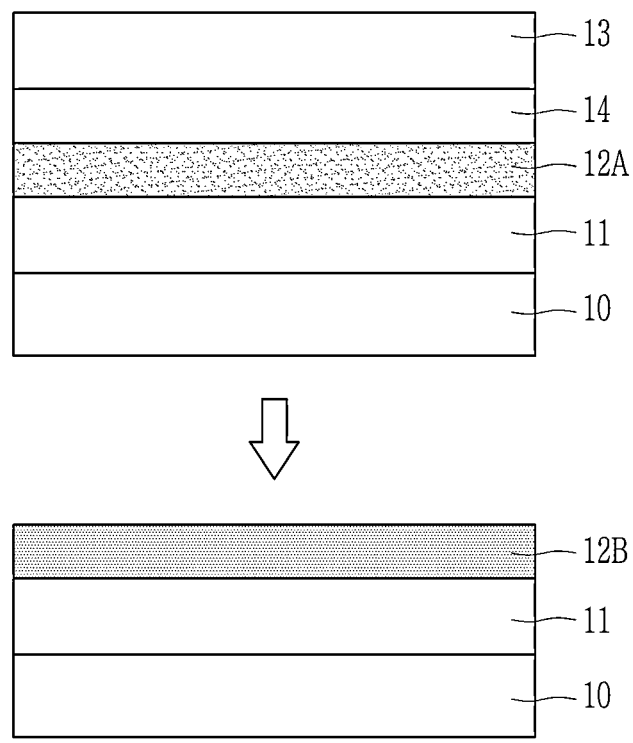
FIG. 2 is a schematic cross-sectional view showing a method of forming a crystalline oxide semiconductor thin film according to another embodiment.

FIG. 2 is a schematic cross-sectional view showing a method of forming a crystalline oxide semiconductor thin film according to another embodiment.

The forming of the crystalline oxide semiconductor thin film 12B according to the present embodiment may include forming an amorphous oxide thin film 12A including indium (In), gallium (Ga), and tin (Sn) on the substrate 10 and annealing the amorphous oxide thin film 12A to form a crystalline oxide semiconductor thin film 12B exhibiting a (009) diffraction peak in the XRD spectrum, as in the aforementioned embodiment.

However, in the method according to the present embodiment, unlike the aforementioned embodiment, the annealing of the amorphous oxide thin film 12A may be performed in a laser annealing method instead of the thermal annealing method. The laser annealing may include radiating light at a wavelength of less than about 500 nm using a laser, for example it may be excimer laser annealing that uses an excimer laser radiating light of a wavelength of greater than or equal to about 100 nm and less than about 360 nm or blue diode laser annealing that uses a blue diode laser radiating light at a wavelength of about 360 nm to about 480 nm.

In order to perform the laser annealing, a crystallization auxiliary layer 13 may be additionally formed. The crystallization auxiliary layer 13 may be formed on the amorphous oxide thin film 12A between the formation of the amorphous oxide thin film 12A and the annealing. The crystallization auxiliary layer 13 may be formed on the amorphous oxide thin film 12A, for example, may cover the whole surface of the amorphous oxide thin film 12A. The crystallization auxiliary layer 13 is an auxiliary layer for crystalizing the amorphous oxide thin film 12A, and may effectively supply and transfer thermal energy required for crystallization of the amorphous oxide thin film 12A.

The crystallization auxiliary layer 13 may include a light absorption inorganic material. The light absorption inorganic material has no particular limit, but may include any inorganic material configured to absorb light of a predetermined wavelength (or light of a predetermined wavelength spectrum) and thus convert the absorbed light into thermal energy, for example, an inorganic material configured to absorb light of a wavelength belonging to at least one of a light ultraviolet (UV) wavelength spectrum, a visible wavelength spectrum, and an infrared wavelength spectrum. An absorption wavelength (or a maximum absorption wavelength of an absorption spectrum) of the light absorption inorganic material may include at least a portion of a wavelength region of less than about 500 nm, and within the above range, greater than or equal to about 100 nm and less than 500 nm, or about 120 nm to about 480 nm, which may be overlapped with the irradiation wavelength of the aforementioned laser.

This light absorption inorganic material may be, for example, an amorphous light absorption inorganic material, for example, a material having a relatively small energy bandgap of about 1.1 eV to about 2.0 eV, and for example, may include amorphous silicon (a-Si).

The formation of the crystallization auxiliary layer 13 may be performed by using the aforementioned light absorption inorganic material, for example, in a vapor deposition process such as physical vapor deposition (PVD) such as sputtering, chemical vapor deposition (CVD), atomic layer deposition, or a combination thereof.

The crystallization auxiliary layer 13 may have a thickness of about 10 nm to about 500 nm, and within the above range, about 10 nm to about 400 nm, about 10 nm to about 300 nm, about 10 nm to about 200 nm, about 20 nm to about 400 nm, about 20 nm to about 300 nm, about 20 nm to about 200 nm, about 30 nm to about 400 nm, about 30 nm to about 300 nm, or about 10 nm to about 200 nm. The thickness of the crystallization auxiliary layer 13 may be larger or smaller than the thickness of the amorphous oxide thin film 12A, and for example, about 0.5 times to about 10 times larger than that of the amorphous oxide thin film 12A.

After the forming of the crystallization auxiliary layer 13, a dehydrogenation process of the crystallization auxiliary layer 13 may be additionally performed. The dehydrogenation process is to remove hydrogen atoms at the surface of and/or inside the crystallization auxiliary layer 13, and for example, may be performed under a nitrogen atmosphere.

The aforementioned amorphous oxide thin film 12A is highly transparent and thus substantially absorbs no light in a short wavelength region, which is radiated by the excimer laser or the blue diode laser, but the crystallization auxiliary layer 13 on the amorphous oxide thin film 12A may absorb light in the short wavelength region and transfer the thermal energy generated therefrom into the amorphous oxide thin film 12A.

For the laser annealing, a capping layer 14 may be additionally formed between the amorphous oxide thin film 12A and the crystallization auxiliary layer 13.

The capping layer 14 may prevent direct exposure of light to the amorphous oxide thin film 12A during the light radiation into the crystallization auxiliary layer 13 and block a reaction between the crystallization auxiliary layer 13 and the amorphous oxide thin film 12A and thus prevent denaturation of material characteristics and simultaneously prevent locally non-uniform heat transfer from the crystallization auxiliary layer 13 to the amorphous oxide thin film 12A, and thus help the crystalline oxide semiconductor thin film 12B to have relatively uniform grains.

The capping layer 14 may include, for example, an insulating material, for example, an oxide, a nitride, an oxynitride, or a combination thereof, for example, an oxide, a nitride, an oxynitride, or a combination thereof including at least one of silicon and aluminum, but is not limited thereto. For example, the capping layer 14 may include a silicon oxide.

The capping layer 14 may have a thickness of, for example, about 10 nm to about 200 nm, and within the above range, about 30 nm to about 150 nm, or about 30 nm to about 120 nm.

The capping layer 14 may be omitted in some cases.

The laser annealing may be performed through several scans with a relatively high output for a very short time or with a relatively low output. For example, the laser annealing may be performed for about 50 μs to about 100 ms with an output of greater than or equal to about 5 W, greater than or equal to about 7 W, greater than or equal to about 8 W, greater than or equal to about 9 W, greater than or equal to about 10 W, about 5 W to about 20 W, about 5 W to about 15 W, about 5 W to about 13 W, about 5 W to about 11.44 W, about 7 W to about 20 W, about 7 W to about 15 W, about 7 W to about 13 W, about 7 W to about 11.44 W, about 8 W to about 20 W, about 8 W to about 15 W, about 8 W to about 13 W, about 8 W to about 11.44 W, about 9 W to about 20 W, about 9 W to about 15 W, about 9 W to about 13 W, about 9 W to about 11.44 W, about 10 W to about 20 W, about 10 W to about 15 W, about 10 W to about 13 W, or about 10 W to about 11.44 W. The laser annealing may be performed through one or more than one scan, for example, scanning of about 1 shot to about 15 shots, about 1 shot to about 10 shots, or about 1 shot to about 5 shots.

The annealing of the crystallization auxiliary layer 13 may rapidly heat the crystallization auxiliary layer 13 up to a high temperature and rapidly cool it down, and this rapid temperature change may change a state of materials forming the crystallization auxiliary layer 13 and/or the amorphous oxide thin film 12A. For example, the crystallization auxiliary layer 13 and/or the amorphous oxide thin film 12A before the annealing may be in an amorphous state but may go through a crystallization state and be turned into a fusion state, as the temperature is rapidly increased. The state and the change rate of the crystallization auxiliary layer 13 and/or the amorphous oxide thin film 12A may be determined by an annealing time, an annealing temperature, and/or an output of a light source (laser).

For example, in the annealing of the crystallization auxiliary layer 13, the crystallization auxiliary layer 13 may have a maximum surface temperature of greater than or equal to about 500° C., greater than or equal to about 600° C., greater than or equal to about 800° C., greater than or equal to about 1000° C., or greater than or equal to about 1200° C., and for example, about 500° C. to about 1800° C., about 600° C. to about 1800° C., about 800° C. to about 1800° C., about 1000° C. to about 1800° C., or about 1200° C. to about 1800° C. At the maximum surface temperature of the crystallization auxiliary layer 13, the crystallization auxiliary layer 13 may be in the crystallization state, a partial fusion state, or a complete fusion state.

In this way, as the temperature of the crystallization auxiliary layer 13 and the amorphous oxide thin film 12A under the crystallization auxiliary layer 13 is increased through this annealing, the amorphous oxide thin film 12A is crystalline and thus formed into a crystalline oxide semiconductor thin film 12B. The whole surface of the amorphous oxide thin film 12A is covered with the crystalline auxiliary layer 13 and thus may be uniformly crystallized.

Crystallinity of the crystalline oxide semiconductor thin film 12B may be determined by an annealing time, an annealing temperature, output of a light source (laser), the number of laser scans, a thickness of the crystallization auxiliary layer 13, and/or the like. For example, as the annealing time is longer, the annealing temperature is higher, the output of a light source (laser) is higher, the number of laser scans is larger, and the thickness of the crystallization auxiliary layer 13 is thicker, the crystallinity of the crystalline oxide semiconductor thin film 12B may be higher. For example, the crystallinity of the crystalline oxide semiconductor thin film 12B may be substantially uniform along a thickness direction of the crystalline oxide semiconductor thin film 12B.

After forming the crystalline oxide semiconductor thin film 12B, the crystallization auxiliary layer 13 may be removed. The removal of the crystallization auxiliary layer 13 may be performed, for example, through dry etching or wet etching, but is not limited thereto.

The crystalline oxide semiconductor thin film 12B may be additionally annealed under an oxygen atmosphere, for example, at a temperature of about 300° C. to about 600° C.

In this way, indium-gallium-tin oxide including indium (In), gallium (Ga), and tin (Sn) may be effectively annealed to obtain a crystalline oxide semiconductor thin film with a c-axis oriented crystal plane. Accordingly, unlike a conventional process of exposing an amorphous oxide to a high temperature of greater than or equal to about 1000° C., and specifically, about 1200° C. for a long time for crystallization, the method of the present disclosure may obtain the crystalline oxide semiconductor with the c-axis oriented crystal plane through annealing for a short time at a relatively low temperature, which may be effective for a low cost large area crystallization method.

The aforementioned crystallization method of the oxide semiconductor may be effectively used as a method of manufacturing an oxide thin film transistor including an oxide semiconductor as an active layer of a thin film transistor.

Figure 3:
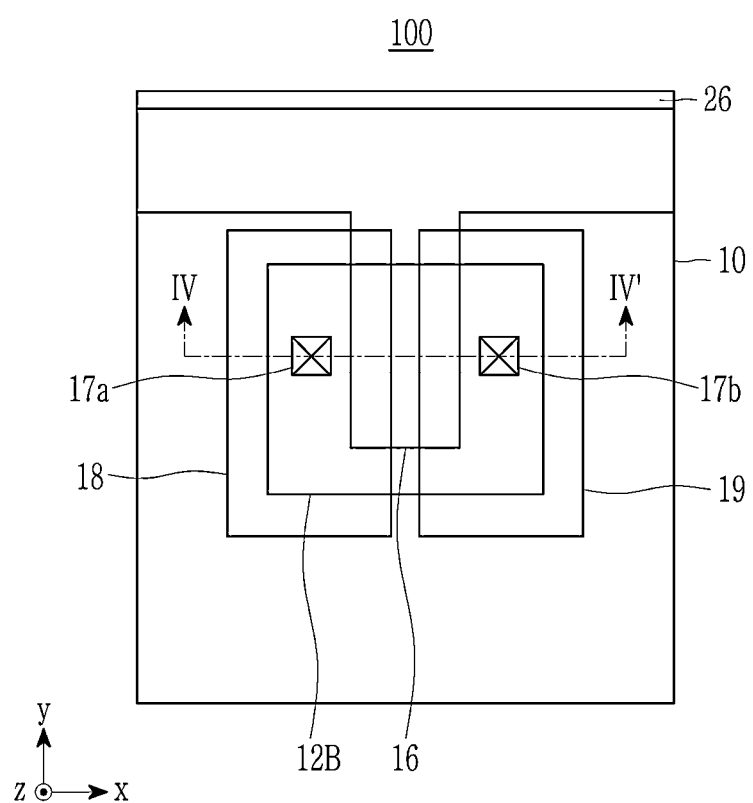
FIG. 3 is a schematic plan view of a thin film transistor according to an embodiment.
Figure 4:
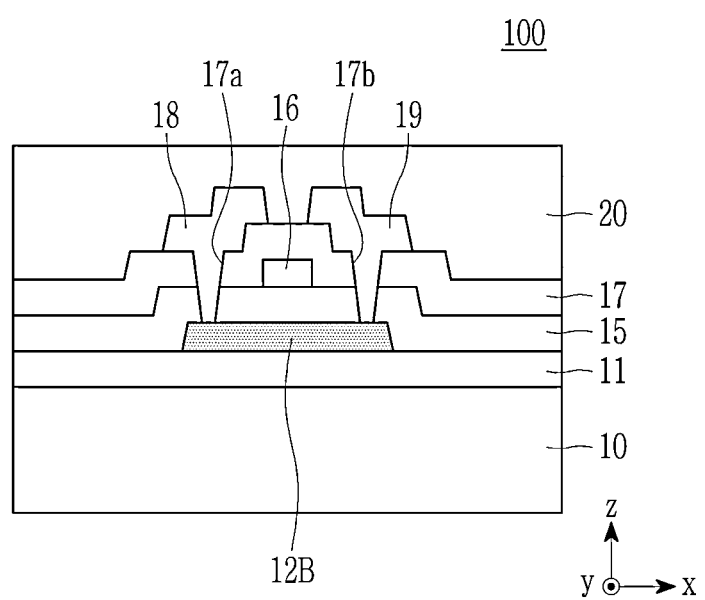
FIG. 4 is a cross-sectional view of the thin film transistor of FIG. 3 taken along line IV-IV'.

FIG. 3 is a schematic plan view of a thin film transistor according to an embodiment, and FIG. 4 is a cross-sectional view of the thin film transistor of FIG. 3 taken along line IV-IV'.

The thin film transistor 100 according to an embodiment includes the substrate 10, the buffer layer 11, the crystalline oxide semiconductor thin film 12B, the gate insulating layer 15, the gate electrode 16, the interlayer insulating film 17, the source electrode 18, the drain electrode 19, and the passivation layer 20.

The substrate 10 and the buffer layer 11 are the same as described above.

The crystalline oxide semiconductor thin film 12B may be an active layer and include a channel region of the thin film transistor 100. The crystalline oxide semiconductor thin film 12B may be an indium-gallium-tin oxide semiconductor thin film, as described above, and may exhibit a (009) diffraction peak in the XRD spectrum and thus have a c-axis oriented crystal plane. The crystalline oxide semiconductor thin film 12B, as described above, may be obtained by crystallizing the amorphous oxide thin film 12A through the thermal annealing or the laser annealing, of which details are the same as described above.

The crystalline oxide semiconductor thin film 12B may have a thickness of, for example, about 20 nm to about 200 nm, and within the above range, about 20 nm to about 180 nm, about 25 nm to about 150 nm, or about 25 nm to about 100 nm.

The gate electrode 16 may be at least partially overlapped with the crystalline oxide semiconductor thin film 12B. The gate electrode 16 is electrically connected to a gate line 26 transmitting a gate signal. The gate electrode 16 may be made of, for example, gold (Au), copper (Cu), nickel (Ni), aluminum (Al), molybdenum (Mo), chromium (Cr), tantalum (Ta), titanium (Ti), an alloy thereof, or a combination thereof, but is not limited thereto. However, when the substrate 10 is a silicon wafer, the gate electrode 16 may be a doped region of the silicon wafer. The gate electrode 16 may have one or two or more layers.

The gate insulating layer 15 may be disposed between the crystalline oxide semiconductor thin film 12B and the gate electrode 16, and may cover the whole surface of the substrate 10. The gate insulating layer 15 may include an organic material, an inorganic material, and/or an organic-inorganic material, and for example, an oxide, a nitride, and/or an oxynitride, for example, a silicon oxide, a silicon nitride, a silicon oxynitride, or a combination thereof, but is not limited thereto. The gate insulating layer 15 may be one layer or at least two layers.

The interlayer insulating film 17 may include an organic material, an inorganic material, or an organic-inorganic material, and for example, an oxide, a nitride, or an oxynitride, for example, a silicon oxide, a silicon nitride, a silicon oxynitride, or a combination thereof, but is not limited thereto. The interlayer insulating film 17 may be one layer or at least two layers. The gate insulating layer 15 and the interlayer insulating film 17 respectively have contact holes 17a and 17b exposing the crystalline oxide semiconductor thin film 12B.

The source electrode 18 and the drain electrode 19 may be electrically connected to a doping region of the crystalline oxide semiconductor thin film 12B through the contact holes 17a and 17b. The source electrode 18 and the drain electrode 19 face each other with the crystalline oxide semiconductor thin film 12B therebetween, and may be electrically connected to the crystalline oxide semiconductor thin film 12B. The source electrode 18 is electrically connected to a data line (not shown) transferring data signals, and the drain electrode 19 may be an island type. The source electrode 18 and the drain electrode 19 may be, for example, formed of gold (Au), copper (Cu), nickel (Ni), aluminum (Al), molybdenum (Mo), chromium (Cr), tantalum (Ta), titanium (Ti), an alloy thereof, or a combination thereof, but is not limited thereto.

The passivation layer 20 is disposed on the source electrode 18 and the drain electrode 19, and may protect and planarize the thin film transistor 100. The passivation layer 20 may include an organic material, an inorganic material, and/or an organic-inorganic material, and for example, an oxide, a nitride, and/or an oxynitride, for example, a silicon oxide, a silicon nitride, a silicon oxynitride, or a combination thereof, but is not limited thereto. The passivation layer 20 may be one layer or at least two layers.

The aforementioned thin film transistor 100 includes the aforementioned crystalline oxide semiconductor thin film 12B as an active layer and thus may have high charge mobility.

A method of manufacturing the aforementioned thin film transistor 100 may include, for example, forming a crystalline oxide semiconductor thin film 12B by the crystallization method; forming a gate electrode 16 that is at least partially overlapped with the crystalline oxide semiconductor thin film 12B; forming a gate insulating layer 15 between the crystalline oxide semiconductor thin film 12B and the gate electrode 16; forming a source electrode 18 and a drain electrode 19 electrically connected to the crystalline oxide semiconductor thin film 12B; and forming a passivation layer 20 on the source electrode 18 and the drain electrode 19.

Specifically, the method of manufacturing the aforementioned thin film transistor 100 may include, for example, forming a buffer layer 11 on the substrate 10; forming an amorphous oxide thin film 12A; annealing the amorphous oxide thin film 12A to form a crystalline oxide semiconductor thin film 12B; forming a gate insulating layer 15 on the crystalline oxide semiconductor thin film 12B; forming a gate electrode 16 on the gate insulating layer 15; forming an interlayer insulating film 17 on the gate electrode 16; forming contact holes 17a and 17b through the gate insulating layer 15 and the interlayer insulating film 17 to expose the crystalline oxide semiconductor thin film 12B; and forming a source electrode 18 and a drain electrode 19 on the interlayer insulating film 17.

The forming of the crystalline oxide semiconductor thin film 12B is the same as described above.

The gate insulating layer 15 may be, for example, formed of an oxide, a nitride, an oxynitride, and/or an organic material through chemical vapor deposition (CVD). The gate insulating layer 15 may be formed as one layer or at least two layers, and for example, an oxide layer formed of an oxide such as a silicon oxide and a nitride layer formed of a nitride such as a silicon nitride. In some cases, the capping layer 14 on the crystalline oxide semiconductor thin film 12B may not be removed but may be used as the gate insulating layer 15.

The gate electrode 16 may be, for example, formed of gold (Au), copper (Cu), nickel (Ni), aluminum (Al), molybdenum (Mo), chromium (Cr), tantalum (Ta), titanium (Ti), an alloy thereof, or a combination thereof, which is, for example, deposited through vapor deposition such as sputtering and then patterned.

The formation of the interlayer insulating film 17 may be, for example, formed of an oxide, a nitride, an oxynitride, and/or an organic material through the chemical vapor deposition (CVD). Subsequently, the gate insulating layer 15 and the interlayer insulating film 17 are patterned to form the contact holes 17a and 17b.

The source electrode 18 and the drain electrode 19 may be, for example, formed of gold (Au), copper (Cu), nickel (Ni), aluminum (Al), molybdenum (Mo), chromium (Cr), tantalum (Ta), titanium (Ti), an alloy thereof, or a combination thereof, which is deposited, for example, through vapor deposition such as sputtering, and then patterned.

The passivation layer 20 may be formed on the source electrode 18 and the drain electrode 19 by chemical vapor deposition of, for example, an oxide, a nitride, an oxynitride, and/or an organic material. The passivation layer 20 may be formed of one or two or more layers, and may include, for example, an oxide layer made of an oxide such as a silicon oxide and a nitride layer made of a nitride such as a silicon nitride.

The aforementioned thin film transistor may be included in various display panels, for example, a liquid crystal display panel, an organic light emitting diode display panel, a quantum dot display panel, or a perovskite display panel.

The aforementioned thin film transistor or display panel may be included in various electronic devices, and for example, may be included in a display device or a semiconductor device.

Hereinafter, the embodiments are illustrated in more detail with reference to examples. However, the following examples are for illustrative purposes and do not limit the scope of claims.

Formation of Crystalline Oxide Semiconductor Thin Film I

Example 1

A 500 nm-thick buffer layer is formed on a glass substrate by depositing a silicon oxide through chemical vapor deposition (CVD). Subsequently, on the buffer layer, an indium-gallium-tin oxide is formed through RF sputtering to form a 50 nm-thick amorphous indium-gallium-tin oxide (IGTO) thin film. Subsequently, the IGTO thin film is put in a furnace and annealed at 700° C. (rising time: 2 hours) for 30 minutes to form a crystalline oxide semiconductor thin film.

Example 2

A crystalline oxide semiconductor thin film is formed according to the same method as Example 1 except that a 100 nm-thick amorphous IGTO thin film is formed instead of the 50 nm-thick amorphous IGTO thin film, and the annealing time is changed to 2 hours.
Evaluation I Crystallinity of the crystalline oxide semiconductor thin films according to Examples 1 and 2 are evaluated.

Figure 5:
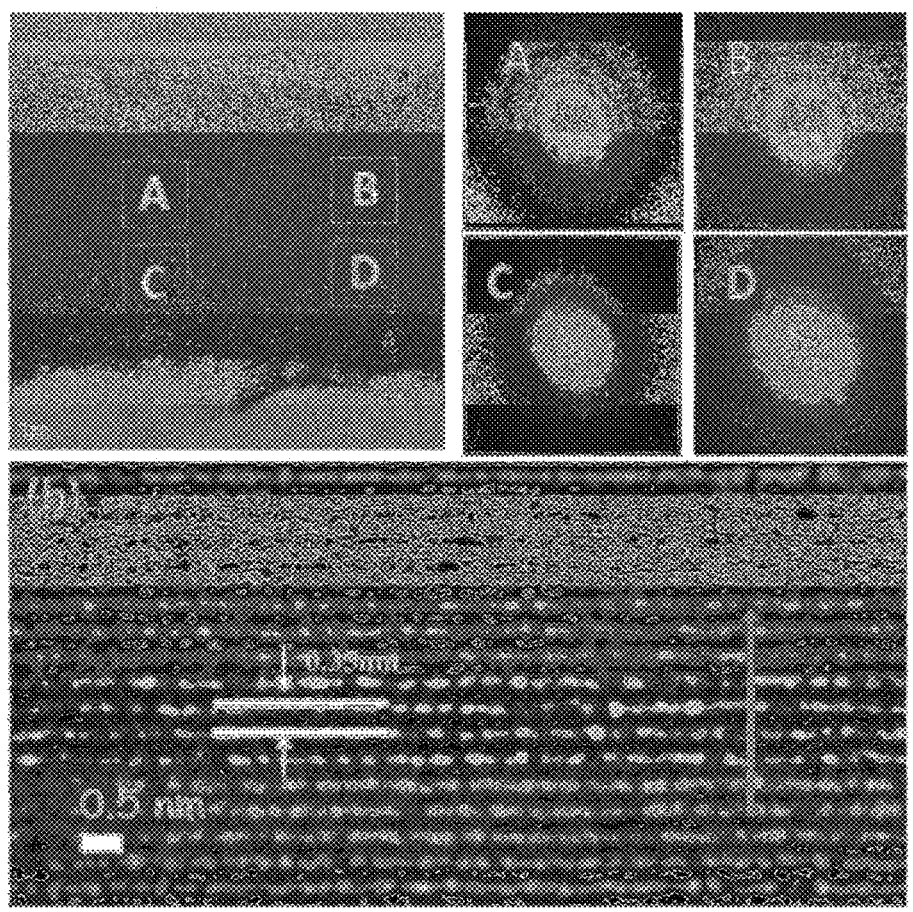
FIG. 5 is a transmission electron microscopic (TEM) photograph of the crystalline oxide semiconductor thin film according to Example 1.
Figure 6:
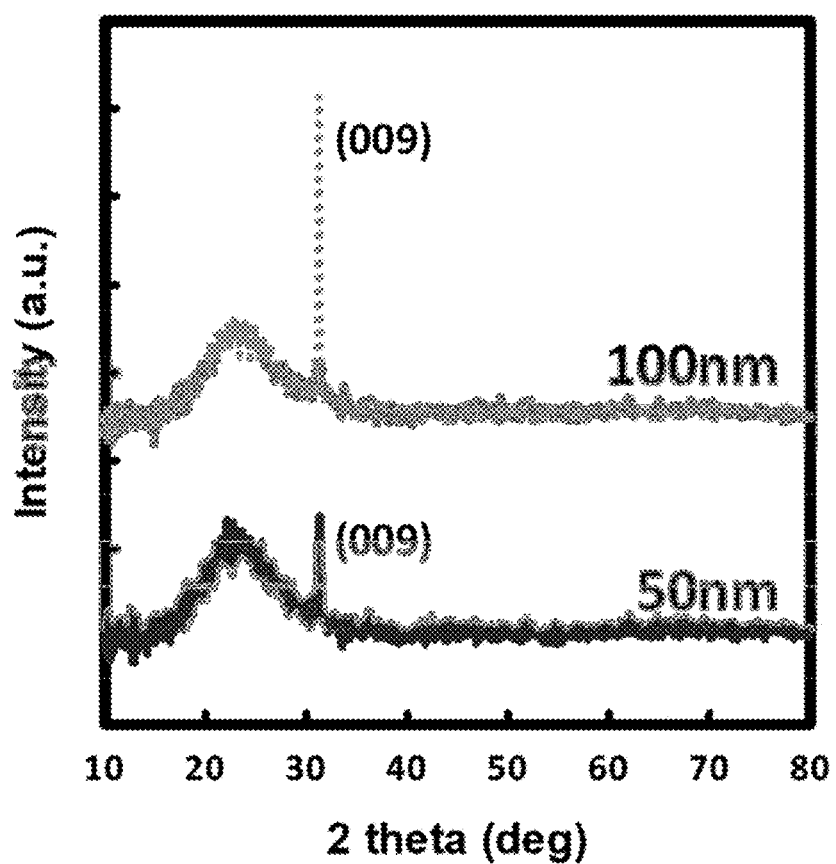
FIG. 6 is an XRD graph of the crystalline oxide semiconductor thin film according to Examples 1 and 2.

FIG. 5 is a transmission electron microscopic (TEM) photograph of the crystalline oxide semiconductor thin film according to Example 1, and FIG. 6 is an XRD graph of the crystalline oxide semiconductor thin film according to Examples 1 and 2.

Referring to FIGS. 5 and 6, the crystalline oxide semiconductor thin films according to Examples 1 and 2 have crystals with a c-axis oriented crystal plane and exhibit a 009 diffraction peak ($2\theta \approx$ around about 31°).

Formation of Crystalline Oxide Semiconductor Thin Film II

Example 3

On a glass substrate, a silicon oxide is deposited through the chemical vapor deposition (CVD) to form a 200 nm-thick buffer layer. Subsequently, on the buffer layer, an indium-gallium-tin oxide is deposited through RF sputtering to form a 50 nm-thick amorphous indium-gallium-tin oxide (IGTO) thin film. The IGTO thin film is annealed by using RTA equipment for 10 minutes or 30 minutes at 800° C. (rising time: 2 minutes) to form a crystalline oxide semiconductor thin film.

Example 4

A crystalline oxide semiconductor thin film is formed according to the same method as Example 3, except that a 100 nm-thick IGTO thin film is formed instead of the 50 nm-thick IGTO thin film.
Evaluation II Crystallinity of the crystalline oxide semiconductor thin films according to Examples 3 and 4 are evaluated.

Figure 7:
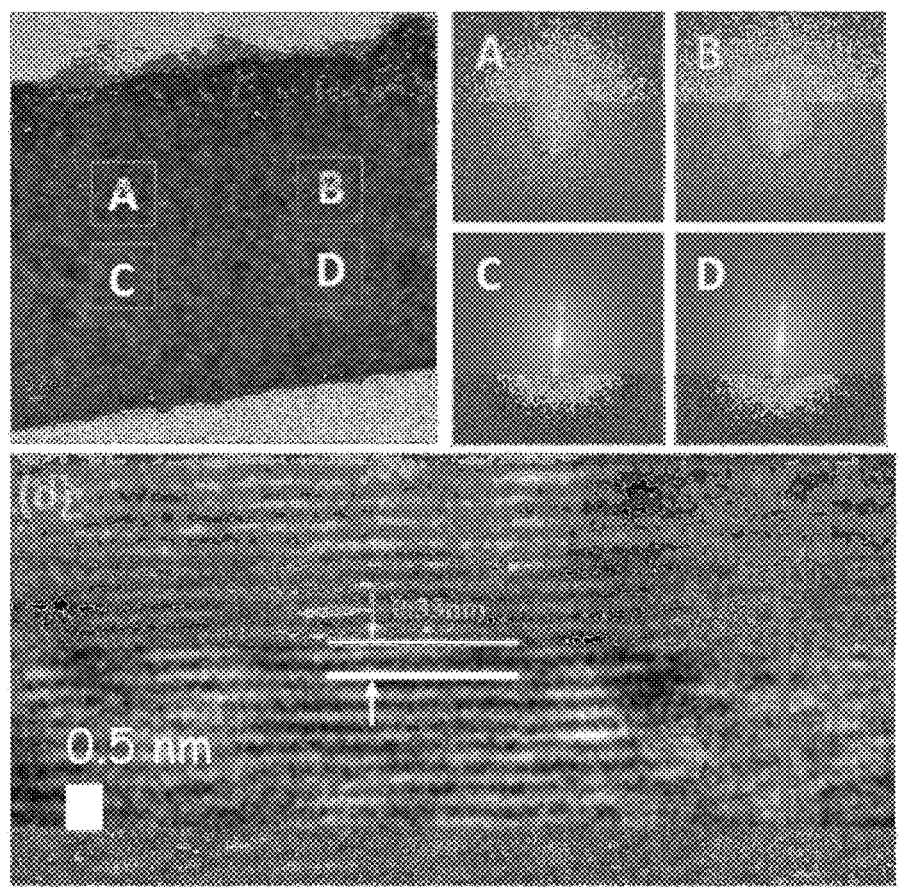
FIG. 7 is a TEM photograph of a crystalline oxide semiconductor thin film according to Example 3.

FIG. 7 is a TEM photograph of a crystalline oxide semiconductor thin film according to Example 3, and FIGS.

8 and 9 are XRD graphs according to annealing time of the crystalline oxide semiconductor thin film according to Examples 3 and 4.

Figure 8:
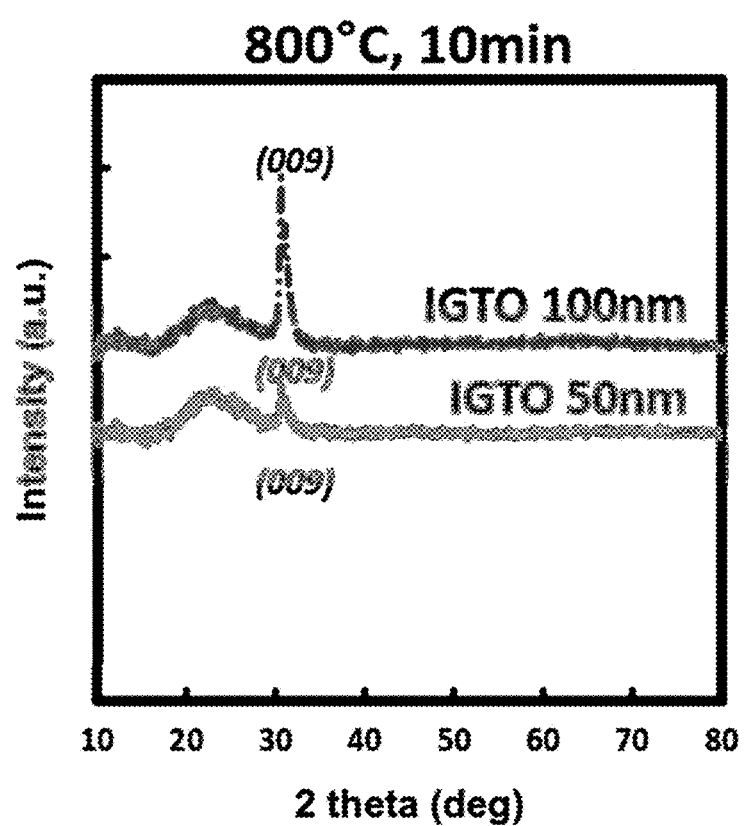
FIGS. 8 and 9 are XRD graphs according to annealing time of the crystalline oxide semiconductor thin film according to Examples 3 and 4.
Figure 9:
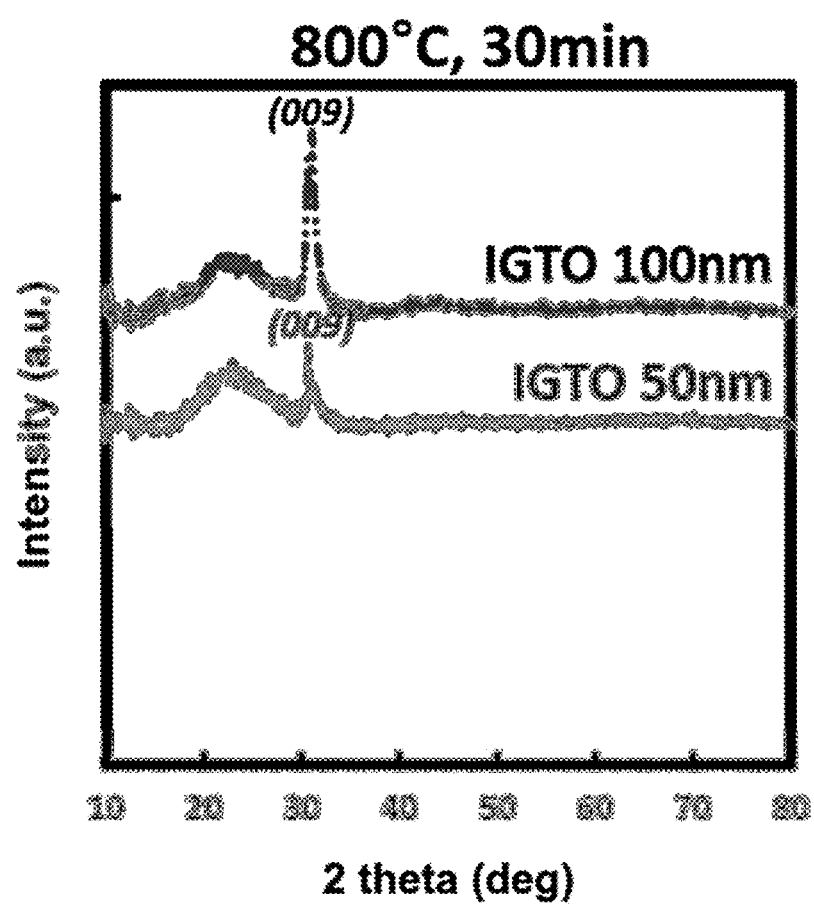

Referring to FIGS. 7 to 9, the crystalline oxide semiconductor thin films according to Examples 3 and 4 have crystals with a c-axis oriented crystal plane and exhibit a 009 diffraction peak (2θ≈around about 31°).

Evaluation III

Electrical properties of the crystalline oxide semiconductor thin films according to Examples 3 and 4 are evaluated. The results are shown in Tables 1 and 2.

TABLE 1

|  | Example 3 (annealing time: 10 minutes) |
|---|---|
| Hole mobility (cm²/Vs) | 13.5 |

TABLE 2

|  | Example 4 | |
|---|---|---|
| Annealing time | 10 minutes | 30 minutes |
| Hole mobility (cm²/Vs) | 13.4 | 11.8 |

Referring to Tables 1 and 2, crystalline oxide semiconductor thin films according to Examples 3 and 4 exhibit sufficient electrical properties.

Formation of Crystalline Oxide Semiconductor Thin Film III

Example 5

On a glass substrate, a silicon oxide is deposited through the chemical vapor deposition (CVD) to form a 500 nm-thick buffer layer. Subsequently, on the buffer layer, an indium-gallium-tin oxide is deposited through RF sputtering to form a 100 nm-thick amorphous indium-gallium-tin oxide semiconductor (IGTO) layer. On the amorphous IGTO layer, a silicon oxide is deposited through the chemical vapor deposition (CVD) to form a 50 nm-thick capping layer. On the capping layer, an amorphous silicon (a-Si) is deposited through the chemical vapor deposition (CVD) to form a 50 nm-thick crystallization auxiliary layer. On the crystallization auxiliary layer, the amorphous indium-gallium-tin oxide (IGTO) thin film is crystallized through 1 shot to 15 shots of blue diode laser annealing with a laser output of 7 W to form a crystalline oxide semiconductor thin film. Subsequently, the crystalline oxide semiconductor thin film is annealed under an oxygen ($O_2$) atmosphere at about 450° C.

Example 6

A crystalline oxide semiconductor thin film is formed according to the same method as Example 5, except that a 100 nm-thick crystallization auxiliary layer instead of the 50 nm-thick crystallization auxiliary layer is formed through 1 shot to 15 shots of blue diode laser annealing with a laser output of 7.2 W.

Evaluation IV

Crystallinity of the crystalline oxide semiconductor thin films according to Examples 5 and 6 are evaluated.

Figure 10:
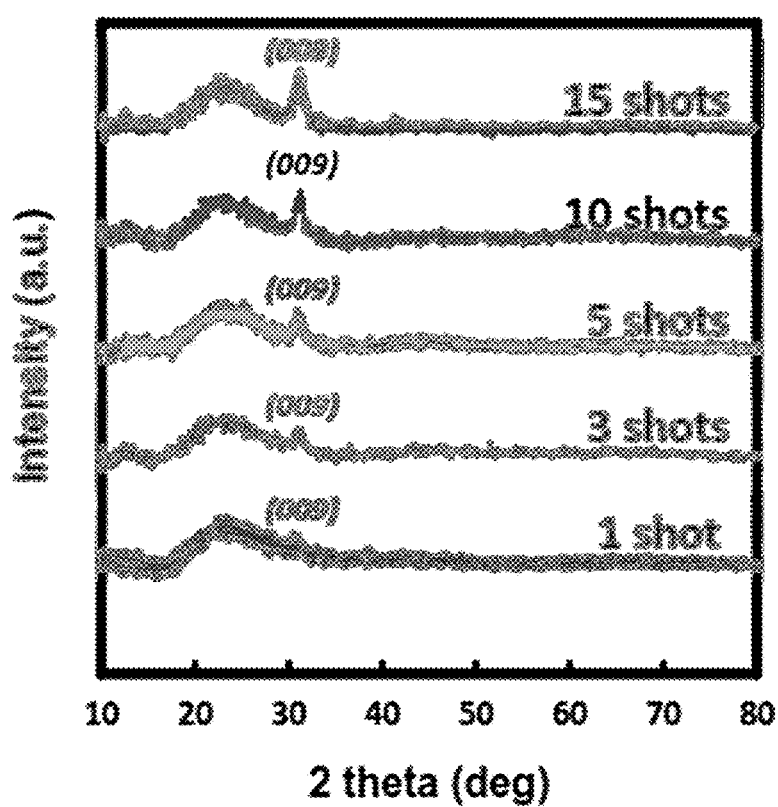
FIG. 10 is an XRD graph of the crystalline oxide semiconductor thin film according to Example 5.
Figure 11:
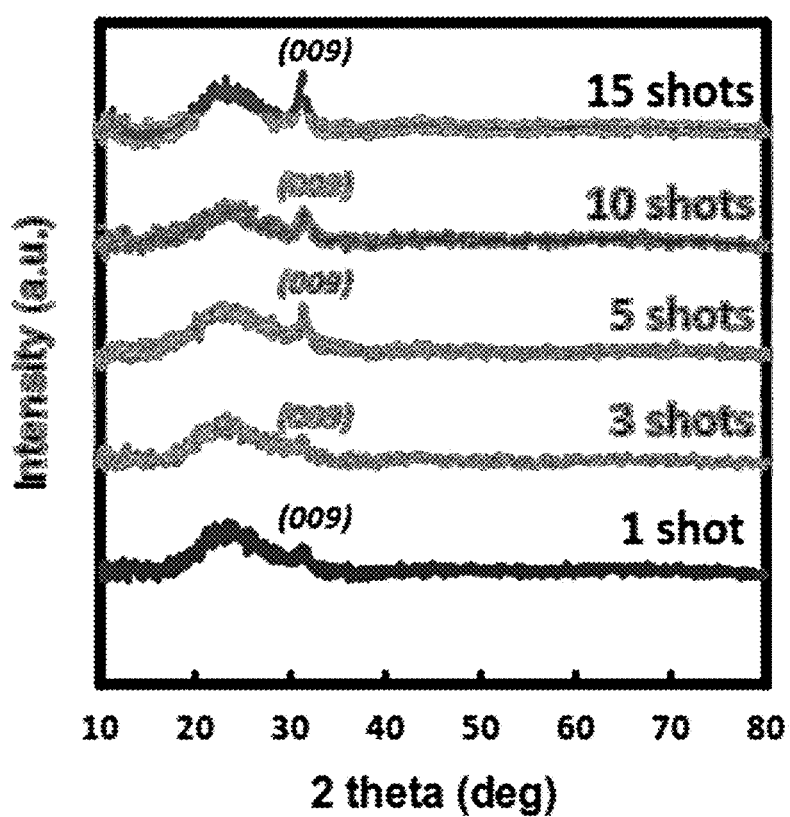
FIG. 11 is an XRD graph of the crystalline oxide semiconductor thin film according to Example 6.
Figure 12:
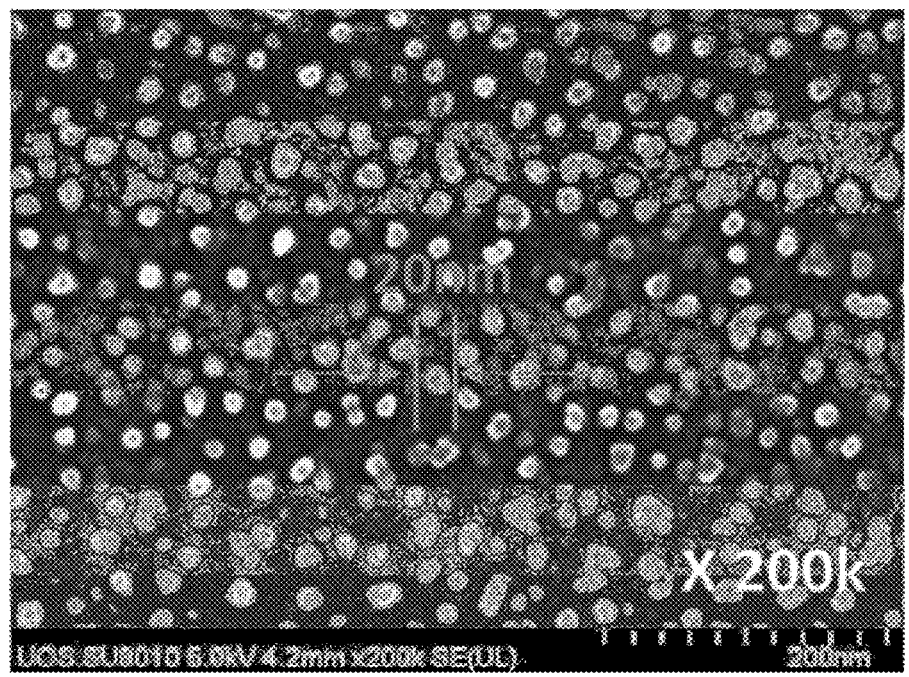
FIG. 12 is a scanning electron microscopic (SEM) photograph of the crystalline oxide semiconductor thin film according to Example 5.

FIG. 10 is an XRD graph of the crystalline oxide semiconductor thin film according to Example 5, FIG. 11 is an XRD graph of the crystalline oxide semiconductor thin film according to Example 6, and FIG. 12 is a scanning electron microscopic (SEM) photograph of the crystalline oxide semiconductor thin film according to Example 5.

Referring to FIGS. 10 to 12, the crystalline oxide semiconductor thin films according to Examples 5 and 6 exhibit a 009 diffraction peak (2θ≈around about 31°) and have grains with a predetermined size. Accordingly, the crystalline oxide semiconductor thin films according to Examples 5 and 6 have crystals with a c-axis oriented crystal plane.

Evaluation V

Electrical properties of the crystalline oxide semiconductors according to Examples 5 and 6 depending on the number of laser scans are evaluated.

The results are shown in Tables 3 and 4.

TABLE 3

|  | Example 5 | | | | |
|---|---|---|---|---|---|
| Number of laser scans (frequency) | 1 | 3 | 5 | 10 | 15 |
| Hole mobility (cm²/Vs) | 3.2 | 3.4 | 3.9 | 3.8 | 3.7 |

TABLE 4

|  | Example 6 | | | | |
|---|---|---|---|---|---|
| Number of laser scans (frequency) | 1 | 3 | 5 | 10 | 15 |
| Hole mobility (cm²/Vs) | 4.4 | 5.6 | 6.2 | 6.6 | 2.7 |

Referring to Tables 3 and 4, the crystalline oxide semiconductors according to Examples 5 and 6 exhibit sufficient electrical properties, which show that there are conditions of bringing about optimal electrical properties.

Manufacture of Thin Film Transistor I

Example 7

On a glass substrate, silicon oxide ($SiO_2$) is deposited through the chemical vapor deposition (CVD) to form a 500 nm-thick buffer layer. Subsequently, on the buffer layer, an indium-gallium-tin oxide is formed through RF sputtering to form a 50 nm-thick amorphous indium-gallium-tin oxide (IGTO) thin film. Subsequently, the amorphous IGTO thin film is put in a furnace and annealed at 700° C. (rising time: 2 hours) for 30 minutes to form a crystalline IGTO semiconductor thin film. The crystalline IGTO semiconductor thin film is annealed under an oxygen ($O_2$) atmosphere at about 450° C. Subsequently, the crystalline IGTO semiconductor thin film is patterned to form an island-typed crystalline oxide semiconductor thin film. On the island-typed crystalline oxide semiconductor thin film, a 100 nm-thick silicon oxide ($SiO_2$) layer is deposited to form a gate insulating layer through plasma enhanced chemical vapor deposition (PECVD). After patterning the gate insulating layer, both sides of the island-typed crystalline oxide semiconductor thin film are n+ doped to form a doping region. Subsequently, on the gate insulating layer, a 100 nm-thick molybdenum layer is formed through sputtering, and is then patterned to form a gate electrode. On the gate electrode, a 300 nm-thick silicon oxide ($SiO_2$) layer is deposited through the plasma enhanced chemical vapor deposition (PECVD) to form an interlayer insulating film. Subsequently, the interlayer insulating film is patterned to form a contact hole exposing the doping region of the island-typed crystalline oxide semiconductor thin film. On the interlayer insulating film, a 200 nm-thick molybdenum layer is formed and patterned to form a source electrode and a drain electrode. Subsequently, on the source electrode and the drain electrode, a 300 nm-thick silicon oxide ($SiO_2$) layer is formed through the chemical vapor deposition (CVD) to form a passivation layer, and is then annealed at 250° C. under vacuum for 4 hours to manufacture a thin film transistor. The thin film transistor has a channel length (L) of about 2 μm and a channel width (W) of about 20 μm.

Example 8

A thin film transistor is manufactured according to the same method as Example 7, except that the amorphous IGTO semiconductor thin film is annealed for 10 minutes at 800° C. (rising time: 2 minutes) with RTA equipment instead of being heat-treated in the furnace to form a crystalline oxide semiconductor thin film.
Evaluation VI Electric field effects, mobility ($\mu_{FE}$), slopes below the threshold voltage (SS), and threshold voltages ($V_{th}$) of the thin film transistors according to Examples 7 and 8 are evaluated.

The results are shown in Table 5.

TABLE 5

|  | $\mu_{FE}$ (cm2/V · s) | SS (V/dec) | $V_{th}$ (V) |
| --- | --- | --- | --- |
| Example 7 | 31.4 | 0.618 | −0.2 |
| Example 8 | 25 | 0.271 | −0.3 |

Referring to Table 5, the thin film transistors according to Examples 7 and 8 exhibit high electrical properties and reliability.

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims.

What is claimed is:

1. A crystalline oxide semiconductor thin film, comprising a crystalline oxide semiconductor consisting of indium, gallium, and tin as metal elements and exhibiting a (009) diffraction peak in an X-ray diffraction spectrum.

2. The crystalline oxide semiconductor thin film of claim 1, wherein the crystalline oxide semiconductor has a c-axis oriented crystal plane.

3. The crystalline oxide semiconductor thin film of claim 1, wherein the crystalline oxide semiconductor thin film has a thickness of about 20 nm to about 200 nm.

4. A thin film transistor, comprising
the crystalline oxide semiconductor thin film of claim 1,
a gate electrode that is at least partially overlapped with the crystalline oxide semiconductor thin film, and
a source electrode and a drain electrode electrically connected to the crystalline oxide semiconductor thin film.

5. A method of forming a crystalline oxide semiconductor thin film, comprising
forming an amorphous oxide thin film consisting of indium, gallium, and tin as metal elements on a substrate, and
annealing the amorphous oxide thin film consisting of indium, gallium, and tin as metal elements to form a crystalline oxide semiconductor thin film consisting of indium, gallium, and tin as metal elements and exhibiting a (009) diffraction peak in the XRD spectrum.

6. A display panel comprising the thin film transistor of claim 4.

7. An electronic device comprising the thin film transistor of claim 4.

8. A method of manufacturing a thin film transistor, comprising
forming a crystalline oxide semiconductor thin film by the method of claim 5,
forming a gate electrode that is at least partially overlapped with the crystalline oxide semiconductor thin film, and
forming a source electrode and a drain electrode electrically connected to the crystalline oxide semiconductor thin film.

9. The method of claim 5, wherein the forming of the amorphous oxide thin film is performed by a vapor deposition process or a solution process.

10. The method of claim 5, wherein the annealing of the amorphous oxide thin film comprises heat-treatment at a temperature of about 500° C. to about 800° C. using a heating device.

11. The method of claim 10, wherein the heating device comprises a furnace or a hot plate.

12. The method of claim 5, wherein the annealing of the amorphous oxide thin film comprises laser annealing.

13. The method of claim 12, wherein the laser annealing is blue diode laser annealing or excimer laser annealing.

14. The method of claim 5, wherein the annealing of the amorphous oxide thin film comprises rapid thermal annealing.

15. The method of claim 14, wherein the rapid thermal annealing is performed at a temperature of about 700° C. to about 950° C.

16. The method of claim 14, wherein
the rapid thermal annealing comprises
raising the temperature at a rate of about 350° C./min to about 600° C./min, and
cooling at a rate of about 350° C./min to about 600° C./min.

* * * * *